United States Patent
Kratzer et al.

(10) Patent No.: US 12,392,829 B2
(45) Date of Patent: Aug. 19, 2025

(54) DEVICE AND METHOD FOR DETERMINING A REMAINING SERVICE LIFE OF AN ELECTRIC MACHINE

(71) Applicant: MAGNA Powertrain GmbH & Co KG, Lannach (AT)

(72) Inventors: Markus Kratzer, Linz (AT); Richard Remplbauer, Neuhofen an der Krems (AT); Johannes Winklinger, Linz (AT)

(73) Assignee: MAGNA Powertrain GmbH & Co KG, Lannach (AT)

( * ) Notice: Subject to any disclaimer, the term of this patent is extended or adjusted under 35 U.S.C. 154(b) by 190 days.

(21) Appl. No.: 18/233,913

(22) Filed: Aug. 15, 2023

(65) Prior Publication Data

US 2024/0061045 A1 Feb. 22, 2024

(30) Foreign Application Priority Data

Aug. 19, 2022 (DE) ...................... 10 2022 208 636.8

(51) Int. Cl.
*G01R 31/34* (2020.01)

(52) U.S. Cl.
CPC .................................. *G01R 31/346* (2013.01)

(58) Field of Classification Search
CPC ....... G01R 31/346; G01R 31/62; G01R 31/72
See application file for complete search history.

(56) References Cited

U.S. PATENT DOCUMENTS

| 8,981,699 B2 | 3/2015 | Obata et al. | |
| 2005/0189889 A1* | 9/2005 | Wirtz | H05K 5/30 318/105 |
| 2005/0218906 A1* | 10/2005 | Younsi | G01R 31/346 324/551 |

OTHER PUBLICATIONS

Prabhakar Neti et al; Online Broadband Insulation Spectroscopy of Induction Machines Using Signal Injection; IEEE Transactions of Industry Applications; vol. 53, No. 2; Mar./Apr. 2017; 9 pages.

* cited by examiner

*Primary Examiner* — Tung X Nguyen
(74) *Attorney, Agent, or Firm* — Dickinson Wright PLLC

(57) ABSTRACT

The invention relates to a method for determining a remaining service life of an electric machine using an insulation measuring device and an electric machine, the insulation measuring device having at least one electric voltage source and the at least one electric voltage source of the insulation measuring device being electrically conductively connected to a phase connection and an earth connection of the electric machine. An object, which is to be able to determine the remaining service life of the electric machine as well as possible, is achieved according to the invention, an electric AC voltage having an amplitude and a frequency being applied in a measuring step between the phase connection and the earth connection using the voltage source, an electric alternating current brought about by the applied electric AC voltage being detected in the phase connection in a subsequent detection step using the insulation measuring device, an impedance between the phase connection and the earth connection being calculated in a subsequent calculation step using the insulation measuring device, and the measuring step, the detection step and the calculation step being repeated with at least one further electric AC voltage having a different amplitude and/or a different frequency, so that a remaining service life of the electric machine can be determined with the aid of the calculated impedances.

5 Claims, 2 Drawing Sheets

Figure 1:
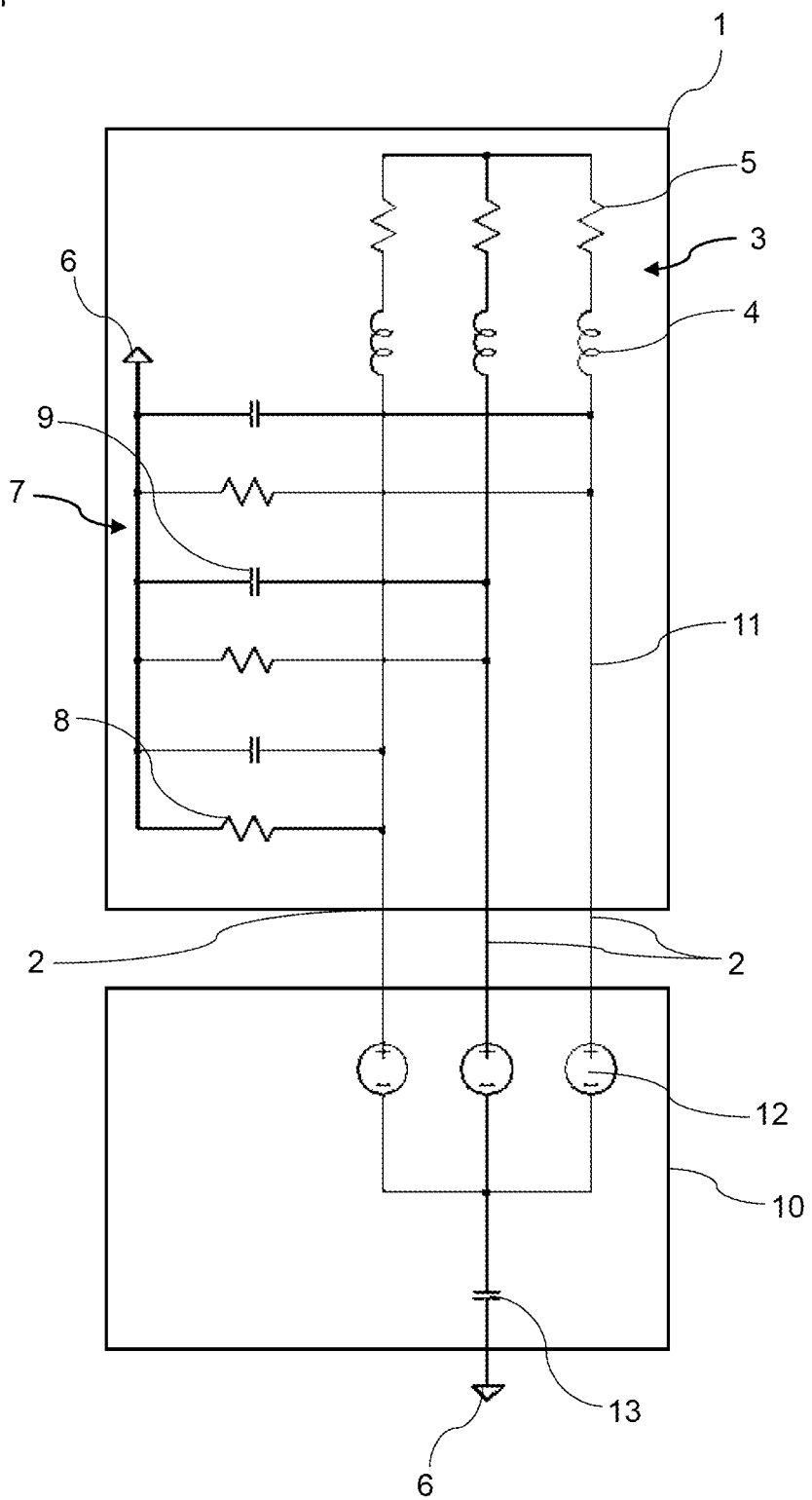

DEVICE AND METHOD FOR DETERMINING A REMAINING SERVICE LIFE OF AN ELECTRIC MACHINE

CROSS-REFERENCE TO RELATED APPLICATION

This application claims priority to German Application No. 10 2022 208 636.8, filed on Aug. 19, 2022. The entire disclosure of the above application is incorporated herein by reference.

FIELD OF THE INVENTION

The invention relates to a device and a method for determining a remaining service life of an electric machine using an insulation measuring device and an electric machine, the insulation measuring device having at least one electric voltage source that is electrically conductively connected to a phase connection and an earth connection of the electric machine.

BACKGROUND OF THE INVENTION

This section provides information related to the present disclosure which is not necessarily prior art.

In practice, electric machines often have a stator, into which a plurality of stator windings are introduced, wherein one task of the stator windings consists in transferring electrical energy into a rotor via a magnetic flux, so that the rotor can convert the electrical energy into a mechanical rotational movement.

In order to be able to ensure correct functioning of the electric machine, the stator windings must be arranged in the stator in an electrically insulated manner with respect to one another, wherein the stator windings also must not be indirectly electrically conductively connected to one another via a metallic stator housing of the stator. In this respect, it is customary to seal the stator windings using a resin or a different electrically insulating insulation material, so that the electrical insulation of the stator windings can be retained over a defined service life, wherein the (remaining) service life directly depends on the insulation effect of the insulation material.

In practice, high requirements are placed on the insulation material, as the insulation material may be exposed to high temperatures, moisture and dirt over the whole service life of the electric machine and nevertheless the insulation effect of the insulation material must not be lost. In this respect, a deteriorating insulation effect of the insulation material can be recognized as the service life of the electric machine progresses, which deteriorating insulation effect becomes noticeable inter alia in that ever more leakage currents can occur in the insulation material until a complete failure of the electric machine may result.

An insulation diagnostic method is known from the published document U.S. Pat. No. 8,981,699 B2 for a rotating electric machine which is installed in an electric vehicle and is driven by an inverter power source; wherein the insulation diagnostic method comprises a partial discharge measuring device, which measures partial discharges which occur in insulated areas between windings or phases of the rotating electric machine and an earth.

One disadvantage of the preceding insulation diagnostic method in this respect is that on the one hand partial discharges always require a very high voltage to occur at all and on the other hand the partial discharges damage the electric machine itself, so that the remaining service life may already be reduced by the insulation diagnostic method, as the partial discharges themselves can damage the insulation material.

SUMMARY OF THE INVENTION

This section provides a general summary of the disclosure, and is not a comprehensive disclosure of its full scope or all of its features.

Therefore, an object of the invention is to provide a device and a method, using which the remaining service life of an electric machine can be determined to the greatest extent possible prior to a failure, so that the electric machine can be put into a safe state for example.

The object is achieved according to a method for determining a remaining service life of an electric machine using an insulation measuring device and an electric machine. The insulation measuring device has at least one electric voltage source that is electrically conductively connected to a phase connection and an earth connection of the electric machine. According to the method, an electric AC voltage having an amplitude and a frequency is applied in a measuring step between the phase connection and the earth connection using the voltage source; an electric alternating current brought about by the applied electric AC voltage is detected in the phase connection in a subsequent detection step using the insulation measuring device; an impedance between the phase connection and the earth connection is calculated in a subsequent calculation step using the insulation measuring device; and the measuring step, the detection step and the calculation step are repeated with at least one further electric AC voltage having a different amplitude and/or a different frequency, so that a remaining service life of the electric machine can be determined with the aid of the calculated impedances.

According to the invention, the object is also achieved by providing a device for determining a service life of an electric machine using an insulation measuring device, wherein the insulation measuring device is operated according to the method according to the invention.

According to the invention, many different AC voltages with different amplitudes and/or frequencies should be applied at the phase and earth connection of the electric machine, wherein the earth connection is usually electrically conductively connected to the stator housing of the stator. During each repetition of the measuring, detection and calculation step, a new impedance can be detected and determined between the phase connection and the earth connection, so that an impedance curve can be created and displayed as a result, which curve reflects the current state of the insulation material of the electric machine.

In this respect, it is possible using the thus-determined impedance curve of the insulation material to infer an insulation conductance and an insulation capacitance of the electric machine. If the insulation resistance and/or the insulation capacitance fall below a lower limit, it is possible to assume an impending failure of the insulation material and therefore of the electric machine, wherein a warning or a notification can be output in advance. Optionally, the electric machine can be brought into a safe state, so that the electric machine can be maintained or replaced before greater damage can occur.

The method according to the invention can be started manually or fixed inspection intervals may also be determined, according to which the method according to the invention is carried out; wherein typical downtimes of the electric machine can be used to record a new impedance curve and to carry out an inspection of the insulation material. Optionally, the method according to the invention can also be carried out in parallel to normal operation of the electric machine, wherein the AC voltages generated by the insulation measuring device can be overlaid on the normal stator winding voltages—a filtering and separation of the alternating current caused by the applied AC voltage from the normal stator current is consequently necessary, if the alternating current is not measured and detected via a path of the earth connection of the electric machine.

According to one advantageous embodiment of the method according to the invention, the insulation measuring device has three electric voltage sources and the electric machine has three phase connections, wherein one electric voltage source in each case is electrically conductively connected to one phase connection in each case and the earth connection of the electric machine, so that using the insulation measuring device, one impedance in each case can be calculated between the phase connection and the earth connection.

The electric machines known from practice usually have at least three stator windings and three phase connections, so it is advantageous according to this embodiment to test all stator windings of the three phase connections simultaneously according to the method according to the invention. As all voltage sources of the insulation measuring device are electrically conductively connected to the earth connection of the electric machine, the AC voltage can be applied to all phase connections simultaneously and all phase connections can be inspected simultaneously.

According to a particularly advantageous embodiment of the method according to the invention, it may be provided that the measured variables determined are stored in a memory device of the insulation measuring device. The impedance curve determined according to the invention can be stored as a measured variable in the memory device, so that a change of the impedance curve can be recognized and detected over the service life of the electric machine. Trend curves of the impedance curve and statistics can in this manner be collected over the service life and subsequently evaluated.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

Figure 2:
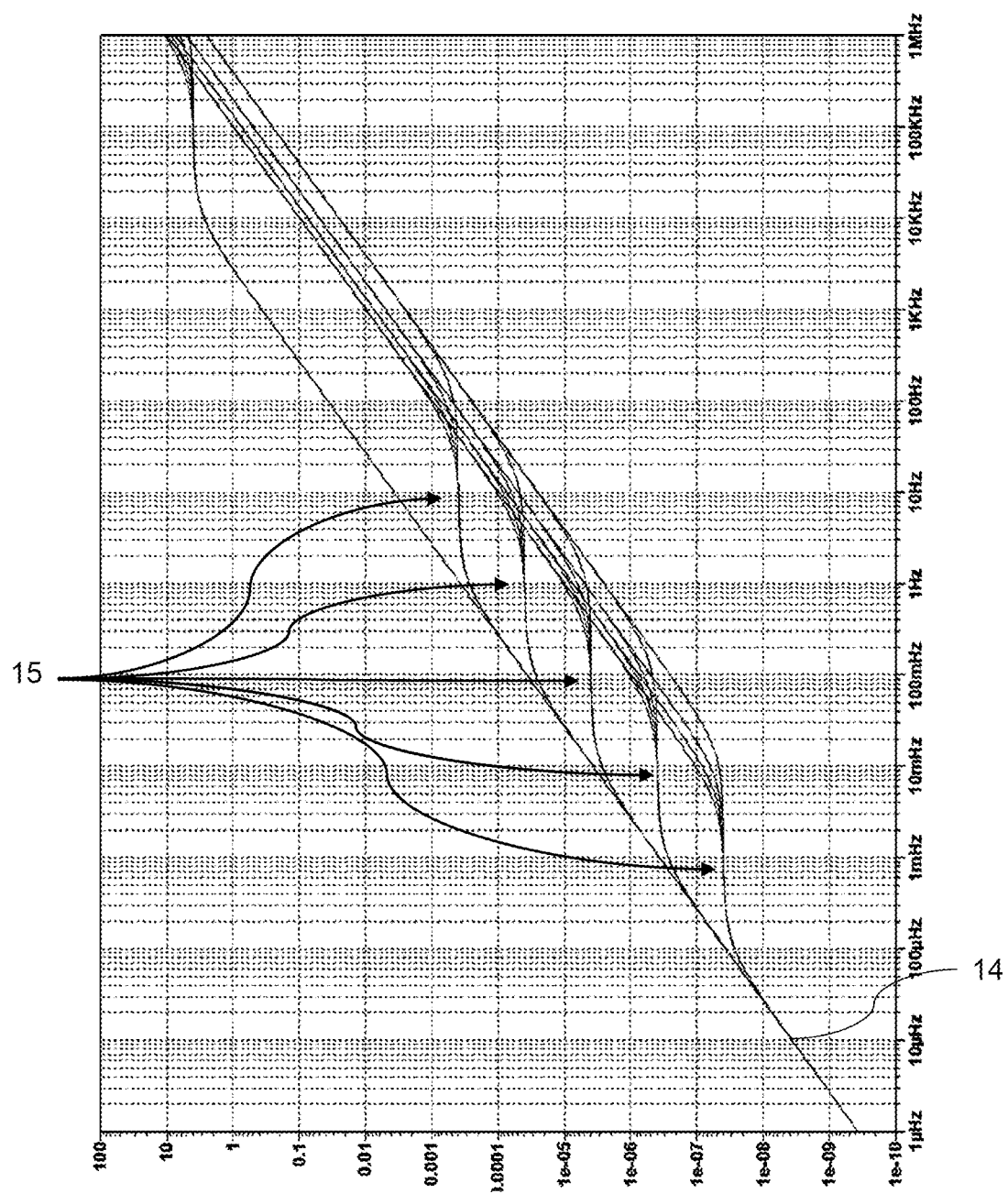

FIG. 1 shows an electric machine and an insulation measuring device in an illustration as a circuit diagram, and FIG. 2 shows a plurality of impedance curves recorded using the insulation measuring device.

DESCRIPTION OF THE INVENTION

FIG. 1 shows an electric machine 1 having three phase connections 2, wherein a stator winding 3 is assigned to each phase connection 2—the stator winding 3 comprises a winding inductance 4 and an ohmic winding resistance 5. Each stator winding 3 has a frequency-dependent impedance 7 with respect to an earth 6, which impedance is represented in each case by an insulation conductance 8 and an insulation capacitance 9.

An insulation measuring device 10 according to the invention is connected to the electric machine 1 or the phase connections 2 thereof, wherein a voltage source 12 is assigned to each phase 11 and the insulation measuring device 10 is connected via a coupling capacitance 13 to the earth 6 of the electric machine 1. In a measuring step, the insulation measuring device 10 can impress an AC voltage on each phase 11 of the electric machine 1, wherein the AC voltage across the insulation impedance 7 and the earth 6 of the electric machine 1 brings about an alternating current, and wherein the alternating current can be detected by the insulation measuring device 10 in a subsequent detection step. The insulation measuring device 10 can calculate an impedance 7 for these alternating quantities from the AC voltage and the detected alternating current in a calculation step. If the measuring step, the detection step and the calculation step are repeated using a plurality of AC voltages of different frequencies, an impedance curve 14, as is illustrated in FIG. 2, can be calculated by the insulation measuring device 10.

FIG. 2 shows a plurality of impedance curves 14, as can be calculated and shown using the insulation measuring device 10 according to the invention, wherein the frequency of the AC voltage is plotted on the abscissa and the unit ohm is plotted on the ordinate.

FIG. 2 shows that each impedance curve 14 rises with the frequency of the applied AC voltage until a plateau 15 is reached across a frequency range, before each impedance curve 14 again exhibits a rise with further rising frequency of the AC voltage from a certain frequency. In this respect, information about the insulation conductance 8 of the insulation impedance 7 can be obtained from the position of the plateau 15, wherein information about the insulation capacitance 9 can be obtained from the starting point of the rise of the impedance curve 14 after the plateau 15 or the length of the plateau 15. If, as the service life progresses, the insulation conductance 8 rises above a specific limit or the plateau 15 of the impedance curve 14 falls below a specific value, safe operation of the electric machine 1 can no longer be ensured. The following applies in this respect: if the specific limit is violated or the plateau 15 changes beyond a certain value, safe operation of the electric machine 1 can no longer be ensured.

What is claimed is:

1. A method for determining a remaining service life of an electric machine using an insulation measuring device and the electric machine, the insulation measuring device having at least one electric voltage source and the at least one electric voltage source of the insulation measuring device being electrically conductively connected to a phase connection and an earth connection of the electric machine, the method comprising:

applying an electric AC voltage having an amplitude and a frequency in a measuring step between the phase connection and the earth connection using the at least one electric voltage source;

detecting an electric alternating current brought about by the applied electric AC voltage in the phase connection in a detection step using the insulation measuring device;

calculating an impedance between the phase connection and the earth connection in a calculation step using the insulation measuring device; and repeating the measuring step, the detection step and the calculation step with at least one further electric AC voltage having a different amplitude and/or a different frequency, so that the remaining service life of the electric machine can be determined with aid of the calculated impedances.

2. The method according to claim 1, wherein the insulation measuring device has three electric voltage sources and the electric machine has three phase connections, wherein one electric voltage source in each case is electrically conductively connected to one phase connection in each case and the earth connection of the electric machine, so that using the insulation measuring device, one impedance in each case can be calculated between the phase connection and the earth connection.

3. The method according to claim 2, wherein measured variables determined are stored in a memory device of the insulation measuring device.

4. A device for determining a remaining service life of an electric machine using an insulation measuring device and the electric machine, the insulation measuring device being operated according to a method according to claim 1.

5. A method for determining a remaining service life of an electric machine, the method comprising: providing an insulation measuring device having at least one electric voltage source being electrically conductively connected to a phase connection and an earth connection of the electric machine; applying an electric AC voltage having and an amplitude and a frequency between the phase connection and the earth connection using the at least one electric voltage source to define a measuring step; detecting an electric alternating current brought about by the applied electric AC voltage in the phase connection using the insulation measuring device to define a detection step; calculating an impedance between the phase connection and the earth connection using the insulation measuring device to define a calculation step; and repeating the measuring step, the detection step and the calculation step with at least one further electric AC voltage having a different amplitude and/or frequency so that the remaining service life of the electric machine can be determined with aid of the calculated impedances.

* * * * *